United States Patent [19]

Sinobad

[11] 4,090,260
[45] May 16, 1978

[54] DIGITAL IMAGE MEMORY ADAPTED TO DISTRIBUTE IMAGE BLANKS

[75] Inventor: Dusan Sinobad, Orsay, France

[73] Assignee: Compagnie Industrielle des Telecommunications Cit-Alcatel S.A., Paris, France

[21] Appl. No.: 699,964

[22] Filed: Jun. 25, 1976

[30] Foreign Application Priority Data

Jul. 1, 1975 France ............................... 75 20678

[51] Int. Cl.² .......................... G11C 8/00; H04N 3/00
[52] U.S. Cl. ............................ 365/237; 340/324 AD; 358/138
[58] Field of Search .... 340/173 R, 324 AD, 173 CR; 358/138

[56] References Cited

U.S. PATENT DOCUMENTS

| 3,242,470 | 3/1966 | Hagelbarger et al. | 340/324 A |
| 3,309,461 | 3/1967 | Deutsch | 358/138 |
| 3,406,387 | 10/1968 | Werme | 340/324 AD |
| 3,499,980 | 3/1970 | Smierciak | 358/138 |
| 3,680,077 | 7/1972 | Hoberecht | 340/324 AD |
| 3,889,244 | 6/1975 | Sinobad | 340/173 C |

Primary Examiner—Stuart N. Hecker
Attorney, Agent, or Firm—Haseltine, Lake & Waters

[57] ABSTRACT

The invention comes within the domain of synthetic images on a cathode screen and concerns a digital memory whose contents are cyclically read to constitute an image on the screen. The memory is divided into blocks each of which contains the data of a part of the image and which are cyclically controlled in such a way that within a line of the image, the blocks are read successively, whereas at the end of a line, a block is skipped. Thus, possible blanks in the image due to the breakdown of one of the blocks are distributed over the image and no longer erase a vertical column of the image.

2 Claims, 1 Drawing Figure

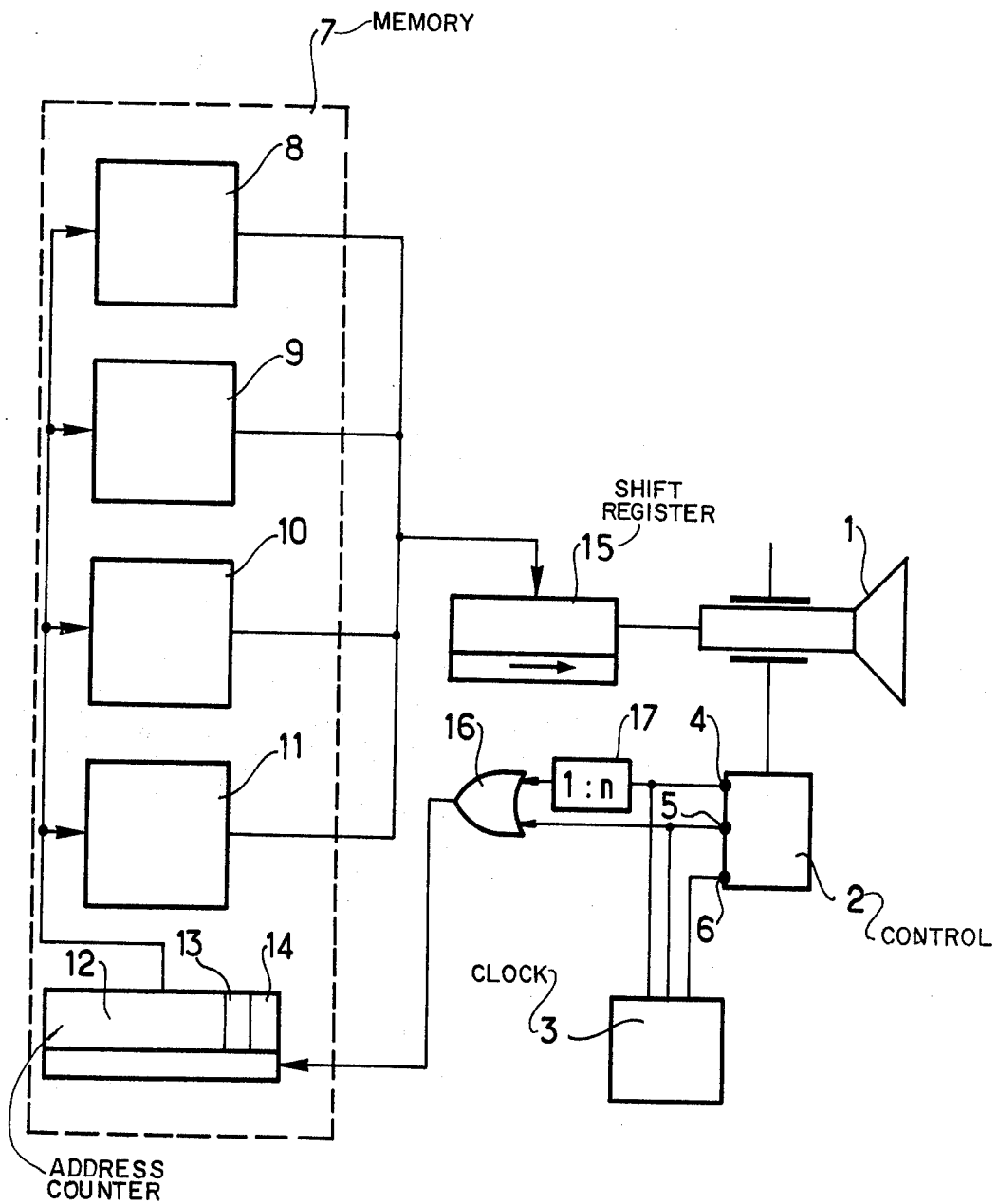

DIGITAL IMAGE MEMORY ADAPTED TO DISTRIBUTE IMAGE BLANKS

The present invention relates to a digital memory for storing an image to be displayed on a cathode ray tube by systematic point by point and line by line scanning of a cathode ray tube display screen.

In a display system designed to synthesise mosaictype images (sequential scanning with appropriate lighting up of successive points), a digital memory which stores data for all the points of the image is needed in which data concerning each point is constituted by one or more bits. Such a memory is read in data words and it is known that the high reading speed required for displaying a picture can often only be obtained by dividing the memory into blocks whose reading cycles are staggered in relation to one another.

In practice, the memory is divided into N blocks in such a way that the data for any one line of the image is distributed equally in all the blocks.

In the case of the breakdown of a block, the image shows vertical blank lines due to the absence of the data of a block. Since the vertical lines constitute for particularly significant elements for interpreting an image whether it be a technical drawing or a document built up letter by letter such a breakdown of a single block can hinder and even prevent the interpretation of the image.

The present invention aims at reducing this disadvantage and proposes a digital memory for scanning an image; which memory is divided into N blocks, the breakdown of any one of which will normally only slightly hinder the interpretation of an image.

The present invention provides a digital memory for an image to be displayed by systematic point by point and line by line scanning of a screen, the memory being divided into N blocks each containing data for the image and which blocks are read cyclically in such a way that successive read out operations concern different blocks, wherein the cyclic control of the read out is controlled by an address counter which receives in addition to clock pulses in synchronism with the read out operations an extra "line" scanning pulse at the end of each line so that data from any one block is not arranged perpendicularly to the lines of the scan.

Preferably, N is a sub-multiple of the number of elementary reading operations necessary for constituting a line of the image.

The above-mentioned vertical blank lines of a concentional memory are therefore eliminated by missing out a block at the end of each line of the image. If one block breaks down, the corresponding blank spaces are isolated from one line to another and there are no blank vertical lines which cross the image from top to bottom.

An embodiment of the invention will be described below by way of example with reference to the sole FIGURE of the accompanying drawing which is a schematic block diagram of the embodiment.

In particular, the FIGURE shows a cathode ray tube 1 with a control circuit 2. The control circuit provides conventional line scanning of the screen of the cathode ray tube to form an image to be displayed. The image is formed point by point along each line. A synchronisation clock 3 supplies the control circuit 2 with a pulse train for controlling the point by point scan of the image (input 4), a pulse train for passing from one scanning line to the next (input 5), and a pulse train concerning the change of image (input 6). The data which is to be displayed on the screen of the tube comes from a memory 7, which is subdivided into four blocks 8, 9, 10 and 11. Each block is connected with a read control circuit (not shown), which ensures parallel reading of the plurality of bits contained in each cell of the block. The timings of the read control units of the various blocks are staggered in relation to one another so that as data is extracted from a cell of one block, the following block is already preparing to read data from another cell.

An address counter 12 common to all the blocks defines the appropriate one of the four blocks by the contents of its two least significant binary elements 13 and 14 and the appropriate cell within the block by its remaining elements.

The bits leave a cell in parallel and are transmitted to a shift register 15, which supplies them serially to the cathode ray tube 1 for displaying a black point or a white point as a function of the binary value of each bit.

The address counter 12 has previously been ensured solely by a pulse train provided by a "divide-by-n" divider 17 ($n$ being the number of bits contained in a memory cell) dividing the point by point pulse train which the synchronisation clock 3 supplies also to the input 4 of the control circuit 2. The memory address in the present embodiment is controlled not only by the point by point pulse train (input 4) but also simultaneously by the change of line pulse train (input 5). These two trains are combined in an OR gate 16. This measure obtains the following effect:

Within each line scan, the blocks are read cyclically, whereas at the end of a line, an advance of two blocks is made. Assume that the blocks are named A, B, C and D and that the cells inside the blocks are numbered from 1 to X and that each line needs the contents of twelve memory cells. In these conditions, two random lines of the image can be described, inasmuch as concerns the source of their data, by the following table.

A1 B1 C1 D1 A2 B2 C2 D2 A3 B3 C3 D3
B4 C4 D4 A5 B5 C5 D5 A6 B6 C6 D6 A7
C7 D7 1 A8B8 C8 D8 A9 B9 C9 D9 . . .

It is evident that the data should be written into the memory in the same way, i.e. a counter similar to the counter 12 should be provided for controlling the loading of the memory and it should be arranged to receive an extra pulse after loading the contents of each line.

The invention is not limited to the embodiment described above. Indeed the embodiment described has a drawback of wasting one memory cell per line. In the table above memory cells A4 and B7 are not used. Where there are a multiplicity of cells to each line such wastage is negligeable, but by slight complication of the counter 12 it can be avoided: for example, the block selection part of the counter can be connected to receive an extra pulse as shown while the cell address part of the counter can be connected to receive only the pulse train provided by the divider 17 (after further division by four) and no extra pulse.

It is also possible to insert more than one extra pulse at the end of each line to increase the stagger of the blanks in the case of a breakdown. The number of blocks and the number of cells per line are design choices and are not restricted to the example described.

What is claimed is:

1. A digital memory for an image to be displayed by systematic point by point and line by line scanning of a television type screen, the memory being comprised of N blocks, each block containing data for the image, an address counter and a read out register connected to said memory, said address counter receiving clock pulses for synchronizing a read out operation of the memory to a writing operation on the screen, to thereby extract display data successively from all the memory blocks, said address counter receiving an additional counting pulse every time a full line has been written on the screen, said blocks being read cyclically so that successive read out operations concern different blocks.

2. A memory according to claim 1, wherein N is a submultiple of the number of elementary read out operations necessary to comprise a line of the image.

* * * * *